United States Patent
Ueda

(10) Patent No.: US 7,577,041 B2
(45) Date of Patent: Aug. 18, 2009

(54) SEMICONDUCTOR MEMORY DEVICE AND WRITING METHOD THEREOF

(75) Inventor: Yoshihiro Ueda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 308 days.

(21) Appl. No.: 11/736,379

(22) Filed: Apr. 17, 2007

(65) Prior Publication Data

US 2007/0297210 A1  Dec. 27, 2007

(30) Foreign Application Priority Data

Jun. 23, 2006  (JP)  ............... 2006-174224

(51) Int. Cl.
*G11C 7/10*  (2006.01)
(52) U.S. Cl. .................. 365/189.05; 365/149; 365/63
(58) Field of Classification Search ............ 365/189.05, 365/63, 149

See application file for complete search history.

(56) References Cited

U.S. PATENT DOCUMENTS

| | | | |
|---|---|---|---|
| 6,097,625 A | 8/2000 | Scheuerlein | |
| 6,529,404 B2 | 3/2003 | Hidaka | |
| 6,618,317 B1 | 9/2003 | Tsuji et al. | |
| 7,277,316 B2 * | 10/2007 | Turner | ......... 365/149 |
| 2002/0067632 A1 * | 6/2002 | Batson et al. | ......... 365/49 |

FOREIGN PATENT DOCUMENTS

JP  2002-170376  6/2002

* cited by examiner

*Primary Examiner*—Tuan T. Nguyen
(74) *Attorney, Agent, or Firm*—Oblon, Spivak, McClelland, Maier & Neustadt, P.C.

(57) ABSTRACT

A semiconductor memory device includes a power supply circuit which generates a write current, a write line to which a logic state is transferred, a first pass transistor connected between the power supply circuit and the write line, and a first register which connects to the write line, receives a logic state of the write line in an input state, stores the received logic state in a storage state, and controls an on/off state of the first pass transistor on the basis of the stored logic state.

20 Claims, 9 Drawing Sheets

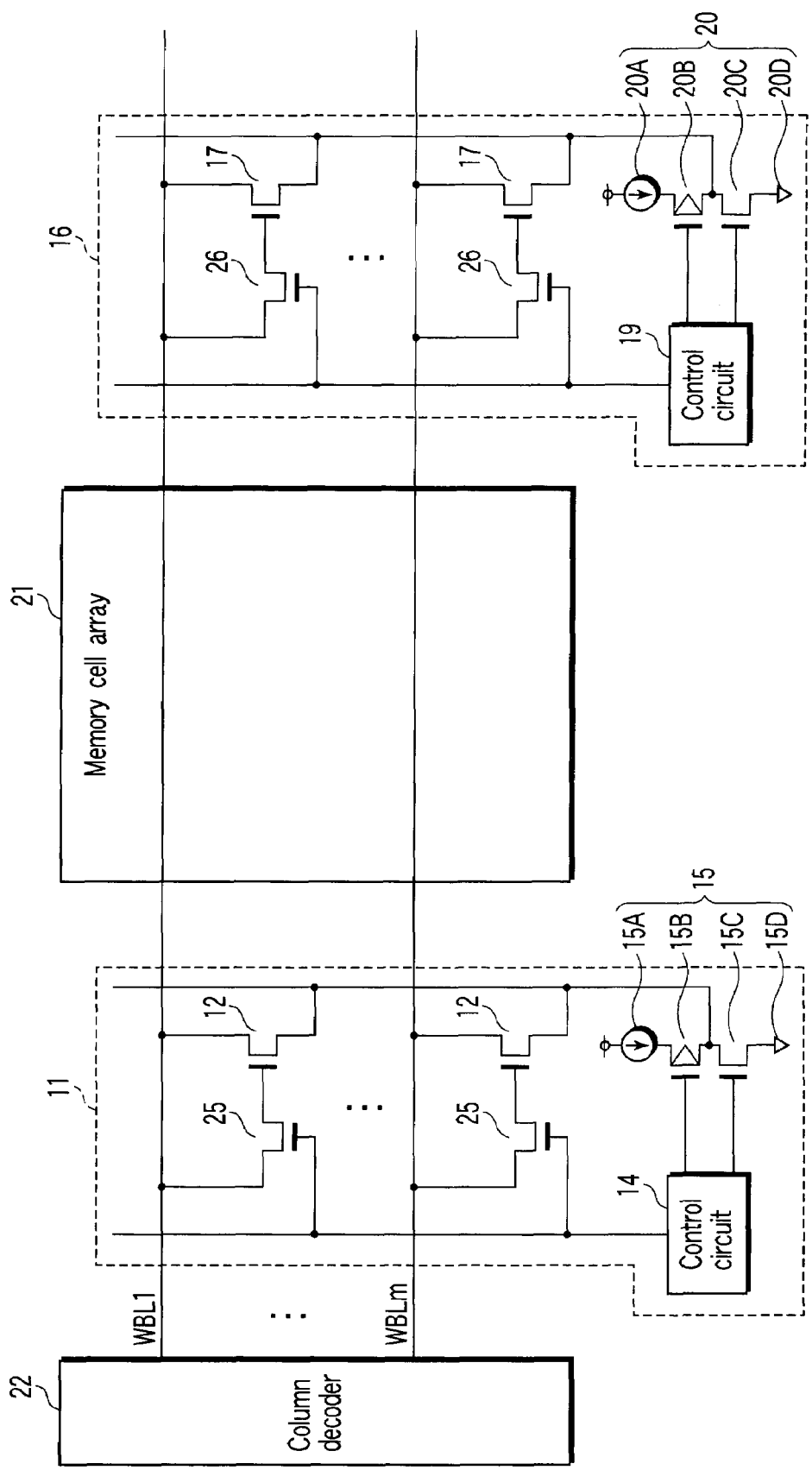
F I G. 8

SEMICONDUCTOR MEMORY DEVICE AND WRITING METHOD THEREOF

CROSS-REFERENCE TO RELATED APPLICATIONS

This application is based upon and claims the benefit of priority from prior Japanese Patent Application No. 2006-174224, filed Jun. 23, 2006, the entire contents of which are incorporated herein by reference.

BACKGROUND OF THE INVENTION

1. Field of the Invention

The present invention relates to a semiconductor memory device and a writing method, for example, to a magnetic memory capable of recording data by supplying a current.

2. Description of the Related Art

In a semiconductor memory device such as a dynamic random access memory (DRAM) or static random access memory (SRAM), a memory cell array is formed by arranging memory cells as data storage units in a matrix. A bit line for selecting a column and a word line for selecting a row of the memory cell array select one memory cell corresponding to a specific address.

A decoder circuit converts an address signal into a selection signal for a specific bit line or word line. This selection signal controls a pass transistor connected between one end of the bit line or word line and a power supply circuit. On the basis of the control signal, the pass transistor, when on, electrically connects the two terminals and, when off, electrically disconnects them. Data is written to or read out from a memory cell by electrically connecting a bit line and word line to the power supply circuit.

A semiconductor memory device is fabricated by forming circuits and the like on a silicon wafer. The ratio occupied by the total area of memory cells in the area of the whole semiconductor memory device is called a cell occupation ratio. As this ratio increases, the cost performance improves, and the semiconductor memory device becomes more desirable. A one-chip memory cell array is divided into a plurality of memory cell arrays in order to reduce the influence of a parasitic capacitance and parasitic resistance on access. A decoder circuit is prepared for a plurality of divided memory cell arrays. If the number of divided memory cell arrays increases, the area of the decoder circuit also increases, and this decreases the cell occupation ratio.

A magnetic random access memory (MRAM) as one semiconductor memory device is expected in respect of non-volatility, high speed, high reliability, and large capacity. A memory cell of a typical MRAM comprises one magnetoresistive element and one selection transistor (U.S. Pat. No. 6,097,625). The magnetoresistive element comprises a magnetic free layer, a magnetic fixed layer, and a nonmagnetic layer sandwiched between them. Data is recorded by using the resistance state which changes in accordance with the direction of magnetization in the magnetic free layer.

Data is written to a memory cell by controlling magnetization of the magnetoresistive element by using a magnetic field generated by currents flowing through a write bit line and write word line which perpendicularly cross each other. The bit-line current is a bidirectional current in order to write data in a memory cell by controlling the direction of magnetization in the magnetic free layer by using a magnetic field in the direction of easy magnetization. The word-line current is a unidirectional current since it selects a memory cell by assisting to write data by a magnetic field in the direction of hard magnetization. A typical wiring configuration comprises write bit lines and write word lines as write lines, and read bit lines and read word lines as read lines (Jpn. Pat. Appln. KOKAI Publication No. 2002-170376).

The MRAM requires power supply circuits at the two ends of a memory cell array in order to drive write currents. In particular, pass transistors are required at the two ends of a bit line in order to drive the bidirectional current at high speed. Accordingly, decoder circuits are also required at the two ends of a memory cell array, and this decreases the cell occupation ratio.

BRIEF SUMMARY OF THE INVENTION

According to a first aspect of the present invention, there is provided a semiconductor memory device comprising: a power supply circuit which generates a write current; a write line to which a logic state is transferred; a first pass transistor connected between the power supply circuit and the write line; and a first register which connects to the write line, receives a logic state of the write line in an input state, stores the received logic state in a storage state, and controls an on/off state of the first pass transistor on the basis of the stored logic state.

According to a second aspect of the present invention, there is provided a semiconductor memory device comprising: a power supply circuit which generates a write current; a write line to which a logic state is transferred; a first pass transistor connected between the power supply circuit and the write line; and a second pass transistor connected between the write line and a gate terminal of the first pass transistor. The first pass transistor has a gate capacitance, and stores a logic state of the write line by using the gate capacitance.

According to a third aspect of the present invention, there is provided a writing method for a semiconductor memory device comprising a pass transistor connected between a power supply circuit and a write line, a register switching the pass transistor, and a memory cell array having a plurality of memory cells connected to the write line, the method comprising: setting the register in an input state; receiving a logic state from the write line to the register; setting the register in the storage state; switching the pass transistor based on an output from the register, the pass transistor supplying a current from the power supply circuit to the write line to writing the memory cell; and initializing the register.

BRIEF DESCRIPTION OF THE SEVERAL VIEWS OF THE DRAWING

FIG. 8 is a circuit block diagram illustrating an MRAM according to the third embodiment;

DETAILED DESCRIPTION OF THE INVENTION

Figure 1:
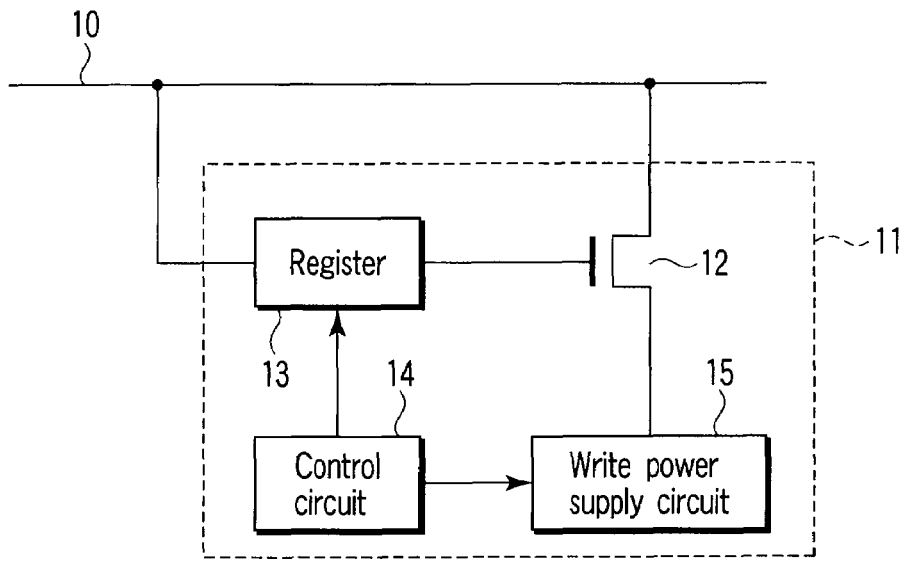
FIG. 1 is a circuit block diagram illustrating a write circuit 11 according to the first embodiment of the present invention.

Embodiments of the present invention will be explained below with reference to the accompanying drawings. Note that in the following explanation, the same reference numerals denote elements having the same functions and arrangements, and a repetitive explanation thereof will be made only where necessary.

First Embodiment

First, the principle of this embodiment will be explained. FIG. 1 is a circuit block diagram illustrating a write circuit 11 according to the first embodiment of the present invention.

The write circuit 11 connects to a write line 10. The write circuit 11 comprises a pass transistor 12 as a switching element, a register 13, a control circuit 14, and a write power supply circuit 15.

The pass transistor 12 is, e.g., an n-channel metal oxide semiconductor (MOS) transistor. The drain terminal of the pass transistor 12 connects to the write line 10. The source terminal of the pass transistor 12 connects to the write power supply circuit 15. The write power supply circuit 15 comprises, e.g., a current source for generating a write current to be supplied to the write line 10, and a current sink (or current drain) for drawing the write current to the ground potential.

The register 13 connects to the gate terminal of the pass transistor 12. The register 13 is also connected to the write line 10. The register 13 has an input state and storage state. In the input state, the register 13 receives a logic state (high or low) determined by the potential (e.g., the power supply potential or ground potential) of the write line 10. In the storage state, the register 13 temporarily stores the logic state received in the input state regardless of the logic state of the write line 10.

The control circuit 14 controls the input state, the storage state, and initialization of the register 13. The control circuit 14 also controls the connection state between the pass transistor 12 and the current source and current sink of the write power supply circuit 15.

Figure 2:
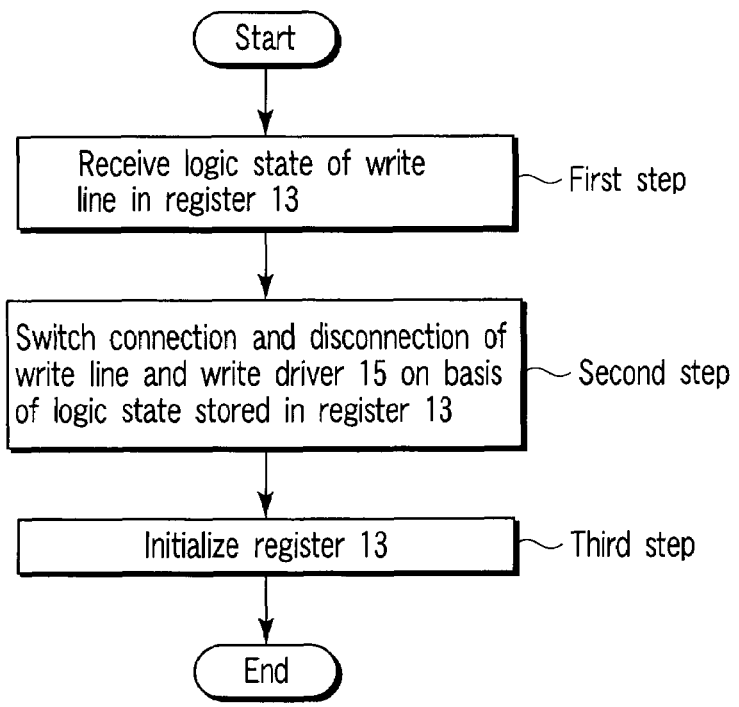
FIG. 2 is a flowchart illustrating the operation of the write circuit 11 shown in FIG. 1.

FIG. 2 is a flowchart illustrating the operation of the write circuit 11. Note that in the initialized state, the register 13 keeps the pass transistor 12 off. Accordingly, the write line 10 and write power supply circuit 15 are electrically disconnected.

In the first step, the control circuit 14 sets the register 13 in the input state. Therefore, the register 13 receives the logic state (high or low) of the write line 10. Note that the potential (e.g., the power supply potential or ground potential) of the write line 10 is set in accordance with whether the write line 10 is selected by a decoder circuit. That is, in the first step, the logic state of selection/non-selection of the write line 10 can be transferred to the register 13.

In the second step, the control circuit 14 sets the register 13 in the storage state. Accordingly, the register 13 temporarily stores the logic state received in the first step regardless of the potential of the write line 10. The register 13 supplies the output to the gate terminal of the pass transistor 12. On the basis of the logic state stored in the register 13, the pass transistor 12 switches connection and disconnection of the write line 10 and write power supply circuit 15.

More specifically, when the logic state of the register 13 is high, the pass transistor 12 electrically connects the write line 10 and write power supply circuit 15. When the logic state of the register 13 is low, the pass transistor 12 electrically disconnects the write line 10 and write power supply circuit 15.

In the third step, the control circuit 14 initializes the register 13. When initialized, the register 13 turns off the pass transistor 12. As a consequence, the pass transistor 12 electrically disconnects the write line 10 and write power supply circuit 15.

Figure 3:
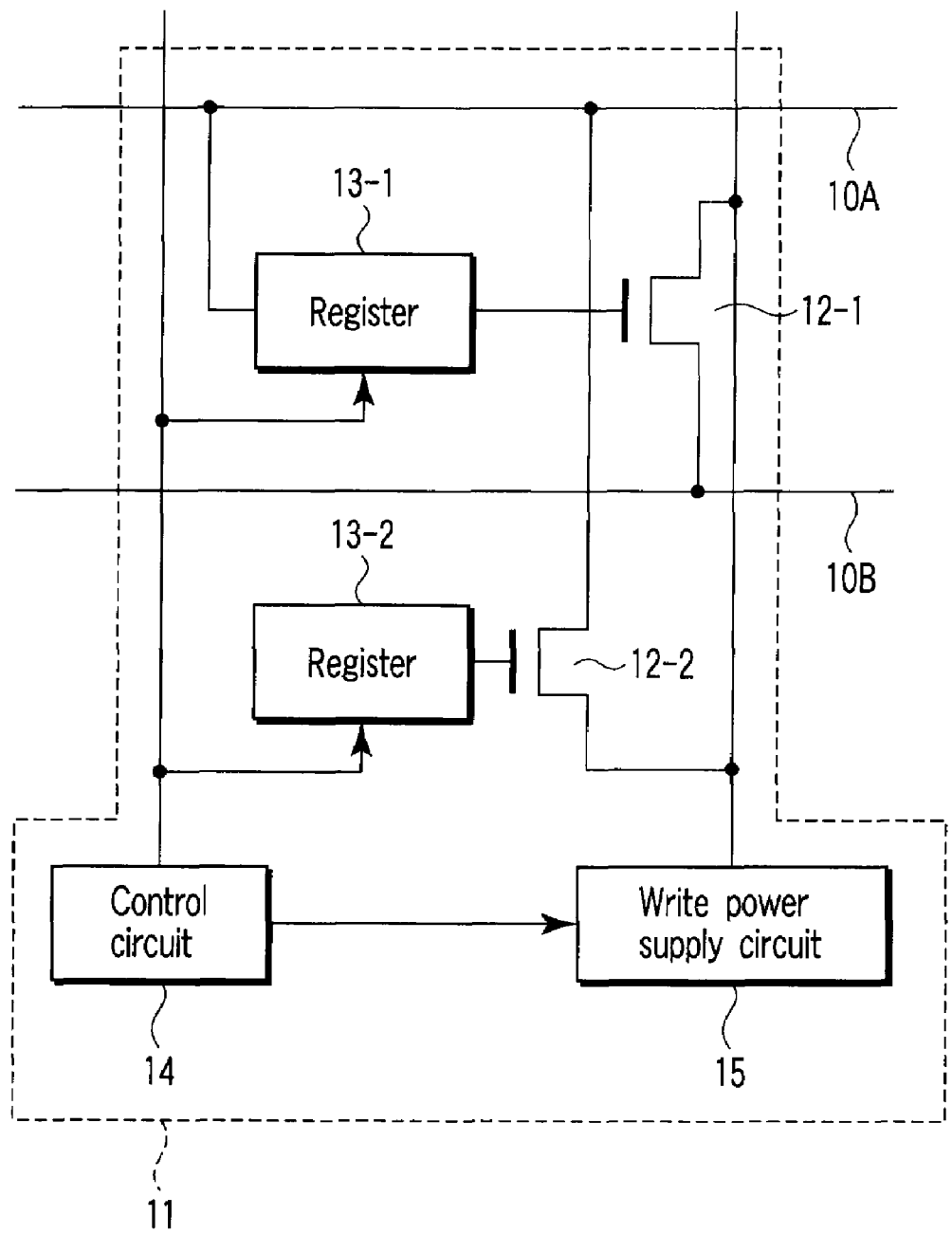
FIG. 3 is a circuit block diagram illustrating another example of the write circuit 11.

Note that a write line to which the logic state is transferred and a write line to which the write power supply circuit 15 supplies the write current may also be different. FIG. 3 is a circuit block diagram illustrating another example of the write circuit 11.

The write circuit 11 includes pass transistors 12-1 and 12-2, registers 13-1 and 13-2, a control circuit 14, and a write power supply circuit 15.

The register 13-1 connects to a first write line 10A. In the input state, therefore, the register 13-1 receives the logic state of the first write line 10A. In the storage state, the register 13-1 temporarily stores the logic state of the first write line 10A.

The register 13-2 connects to a second write line 10B. In the input state, therefore, the register 13-2 receives the logic state of the second write line 10B. In the storage state, the register 13-2 temporarily stores the logic state of the second write line 10B.

The register 13-1 connects to the gate terminal of the pass transistor 12-1. The drain terminal of the pass transistor 12-1 connects to the second write line 10B. The source terminal of the pass transistor 12-1 connects to the write power supply circuit 15.

The register 13-2 connects to the gate terminal of the pass transistor 12-2. The drain terminal of the pass transistor 12-2 connects to the first write line 10A. The source terminal of the pass transistor 12-2 connects to the write power supply circuit 15.

The pass transistor 12-1 switches connection and disconnection of the second write line 10B and write power supply circuit 15 on the basis of the logic state stored in the register 13-1. The pass transistor 12-2 switches connection and disconnection of the first write line 10A and write power supply circuit 15 on the basis of the logic state stored in the register 13-2.

With this configuration, the write circuit 11 can connect the write power supply circuit 15 to a write line other than a specific write line, on the basis of the logic state of the specific write line.

Figure 4:
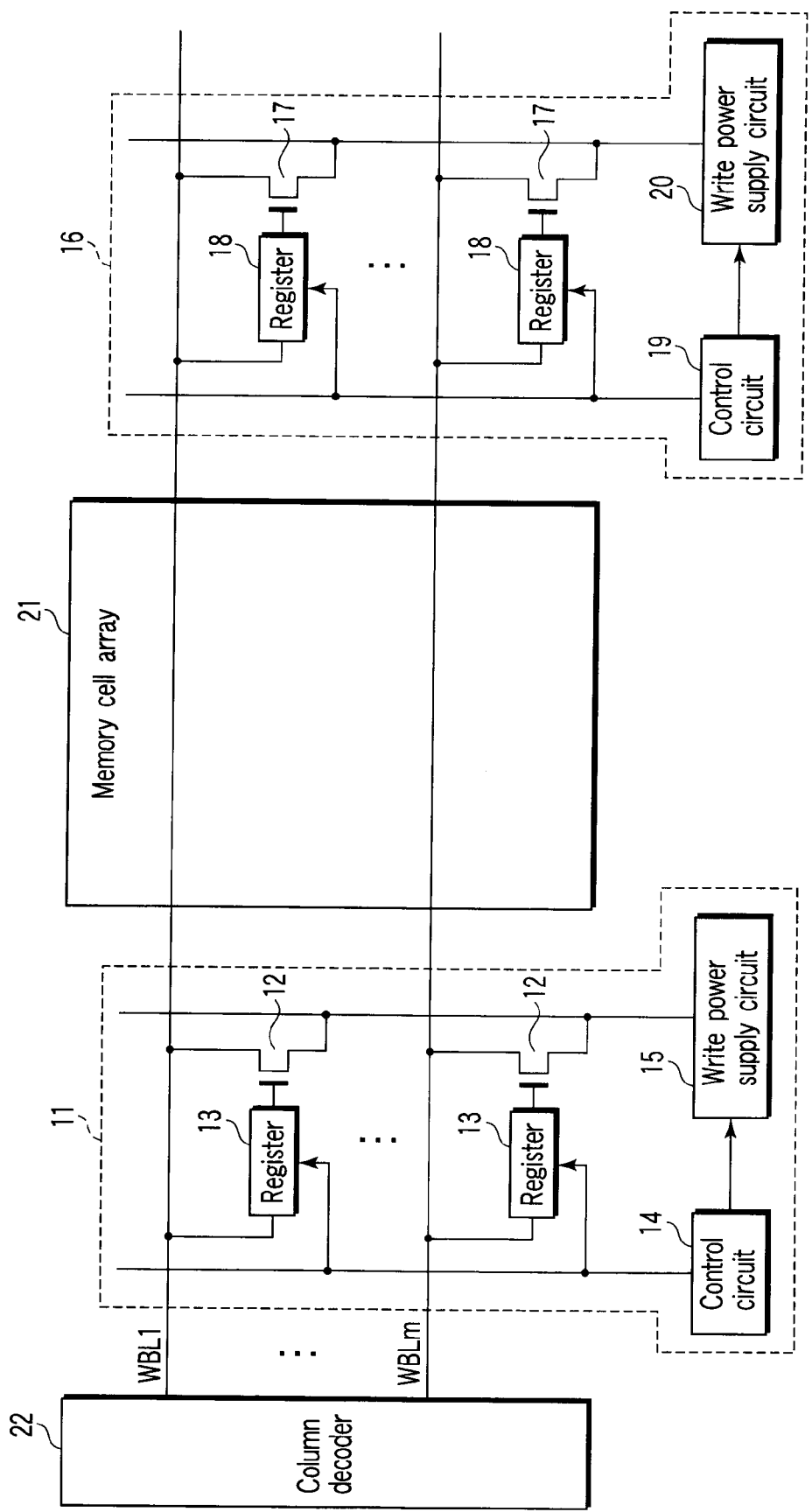
FIG. 4 is a circuit block diagram illustrating an MRAM according to the first embodiment.

A configuration in which the write circuit 11 is applied to an MRAM will be explained below. FIG. 4 is a circuit block diagram illustrating the MRAM according to the first embodiment. The MRAM comprises a memory cell array 21, column decoder 22, first write circuit 11, and second write circuit 16.

Figure 5:
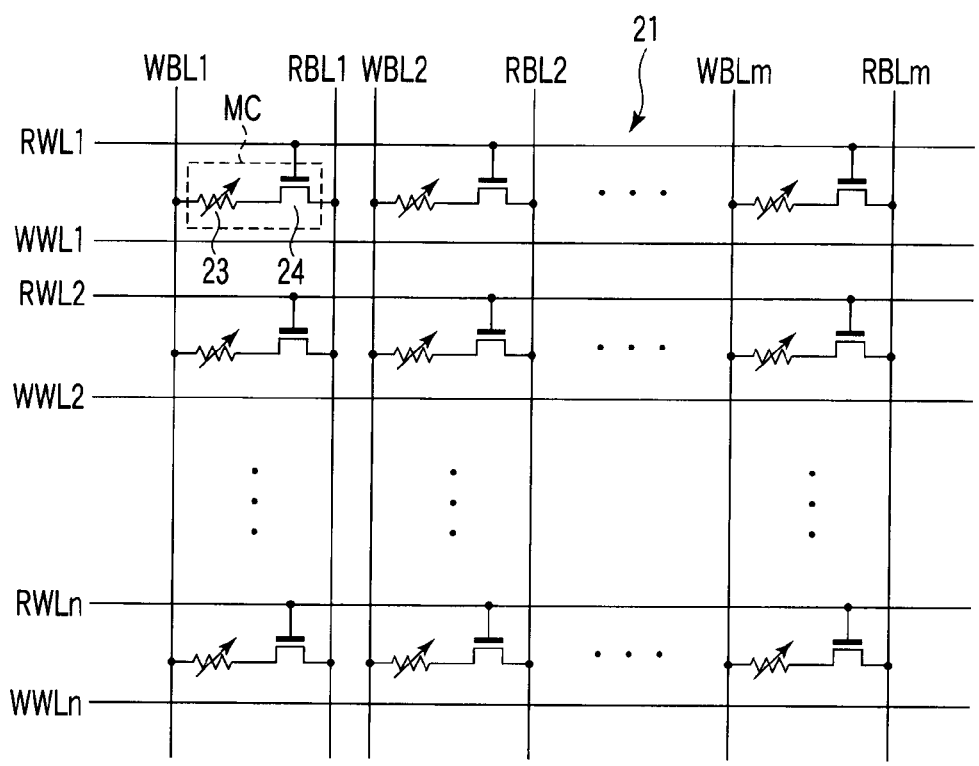
FIG. 5 is a circuit diagram illustrating a memory cell array 21 shown in FIG. 4.

The memory cell array 21 is formed by arranging a plurality of memory cells MC in a matrix of n rows×m columns. An MRAM cell is used as each memory cell MC. FIG. 5 is a circuit diagram illustrating the memory cell array 21.

The memory cell array 21 includes a plurality of write word lines WWL1 to WWLn and a plurality of read word lines RWL1 to RWLn in one-to-one correspondence with the rows of the memory cells MC. The memory cell array 21 also includes a plurality of write bit lines WBL1 to WBLm and a plurality of read bit lines RBL1 to RBLm in one-to-one correspondence with the columns of the memory cells MC. The write word line WWL and read word line RWL select a row of the memory cell array 21. The write bit line WBL and read bit line RBL select a column of the memory cell array 21.

The memory cell MC comprises a magnetoresistive element 23 and selection transistor 24. The selection transistor 24 is, e.g., an n-channel MOS transistor. One terminal of the magnetoresistive element 23 connects to the write bit line WBL. The other terminal of the magnetoresistive element 23 connects to the drain terminal of the selection transistor 24. The gate terminal of the selection transistor 24 connects to the read word line RWL. The source terminal of the selection transistor 24 connects to the read bit line RBL. The write word line WWL runs in the row direction near the memory cell MC.

Figure 6:
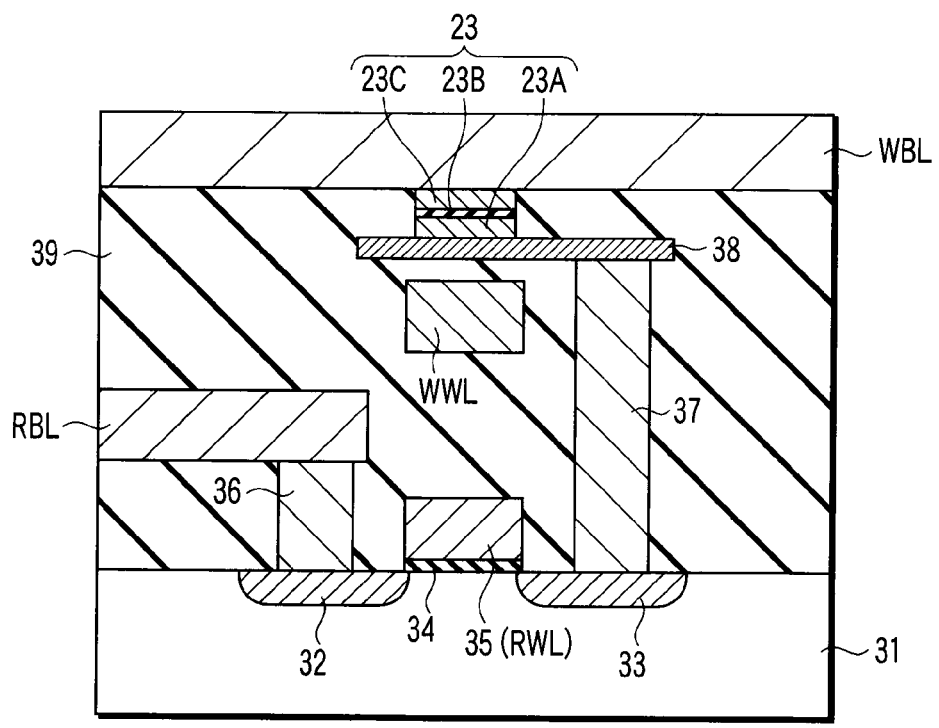
FIG. 6 is a sectional view illustrating a memory cell MC.

FIG. 6 is a sectional view illustrating the memory cell MC. Note that FIG. 6 is a sectional view in which the memory cell MC is cut in the direction in which the bit line runs.

A source region 32 and drain region 33 are formed in a p-type semiconductor substrate 31. The semiconductor substrate 31 is made of, e.g., Si (silicon). Each of the source region 32 and drain region 33 is an $n^+$-type diffusion region formed by heavily doping an $n^+$-type impurity (e.g., P (phosphorous) or As (arsenic)) into silicon.

Between the source region 32 and drain region 33, a gate electrode 35 is formed on the p-type semiconductor substrate 31 via a gate insulating film 34. The gate electrode 35 corresponds to the read word line RWL. The gate insulating film 34 is, e.g., a silicon oxide film. The gate electrode 35 is made of, e.g., polysilicon.

The read bit line RBL is formed above the source region 32 via a via plug 36. An extraction electrode 38 is formed above the drain region 33 via a via plug 37. The magnetoresistive element 23 is formed on the extraction electrode 38 via a lower electrode (not shown).

The write bit line WBL is formed on the magnetoresistive element 23 via an upper electrode (not shown). The write word line WWL is formed below the magnetoresistive element 23 with a predetermined spacing between them. The via plugs and wiring layers are made of, e.g., copper (Cu). An interlayer dielectric layer 39 made of a silicon oxide film or the like fills the portion between the p-type semiconductor substrate 31 and write bit line WBL.

The magnetoresistive element 23 has a stacked structure in which a magnetic fixed layer (pinned layer) 23A, tunnel barrier layer 23B, and magnetic free layer (free layer) 23C are sequentially stacked. The direction of magnetization (or spin) is fixed in the pinned layer 23A. The direction of magnetization changes (reverses) in the free layer 23C. The direction of easy magnetization in each of the pinned layer 23A and free layer 23C is set, e.g., parallel to the film surface.

The pinned layer 23A and free layer 23C are made of a ferromagnetic material. The tunnel barrier layer 23B is made of a nonmagnetic material, e.g., an insulator. Examples of the insulator are magnesium oxide (MgO) and aluminum oxide ($AlO_x$).

The magnetoresistive element 23 has a magnetoresistive effect which changes the resistance value in accordance with the directions of magnetization in the pinned layer 23A and free layer 23C. That is, when the directions of magnetization in the pinned layer 23A and free layer 23C are antiparallel (opposite directions), the resistance value of the magnetoresistive element 23 is largest. This state is defined as, e.g., data "1". On the other hand, when the directions of magnetization in the pinned layer 23A and free layer 23C are parallel (the same direction), the resistance value of the magnetoresistive element 23 is smallest. This state is defined as, e.g., data "0".

Data is written (recorded) to the memory cell MC by using the write bit line WBL and write word line WWL. The write bit line WBL applies a magnetic field in the direction of easy magnetization to the magnetoresistive element 23. The write word line WWL applies a magnetic field in the direction of hard magnetization to the magnetoresistive element 23.

The magnetic field generated from the write bit line WBL controls the direction of magnetization in the free layer 23C. Therefore, a bidirectional current is supplied to the write bit line WBL. On the other hand, the write word line WWL selects a memory cell by assisting to write data by generating a magnetic field in the direction of hard magnetization. Accordingly, a unidirectional current is supplied to the write word line WWL.

Data is read out from the memory cell MC by using the read word line RWL and read bit line RBL. In data read, the read word line RWL switches ON and OFF of the selection transistor 24. In data read, the read bit line RBL supplies a read current to the magnetoresistive element 23.

As shown in FIG. 4, the first write circuit 11 and second write circuit 16 connect to the write bit line WBL. Also, the first write circuit 11 and second write circuit 16 are arranged so as to sandwich the memory cell array 21. Note that this embodiment will explain the write bit line WBL as an example of the line connected to the first write circuit 11 and second write circuit 16. However, the write word line WWL or the like may also be used as the line connected to the write circuits 11 and 16.

The first write circuit 11 comprises a control circuit 14, a write power supply circuit 15, and a plurality of registers 13 and a plurality of pass transistors 12 corresponding to the write bit lines WBL1 to WBLm. The connection relationships between the registers 13, pass transistors 12, control circuit 14, and write power supply circuit 15 are the same as shown in FIG. 1.

The second write circuit 16 comprises a control circuit 19, a write power supply circuit 20, and a plurality of registers 18 and a plurality of pass transistors 17 corresponding to the write bit lines WBL1 to WBLm. The connection relationships between the registers 18, pass transistors 17, control circuit 19, and write power supply circuit 20 are the same as shown in FIG. 1. Each of the write power supply circuits 15 and 20 includes a current source for generating a write current to be supplied to the write bit line WBL, and a current sink (current drain) for drawing the write current to the ground potential.

The column decoder 22 connects to the write bit lines WBL. The column decoder 22 decodes an externally supplied column address signal, and selects a corresponding one of the write bit lines WBL.

The operation of the MRAM having the above arrangement will be explained below. First, an operation when the write current flows from the first write circuit 11 to the second write circuit 16 through the write bit line WBL will be explained.

Assume that in order to write data in an arbitrary memory cell MC of the memory cell array 21, the column decoder 22 has activated the write bit line WBL1 (has set it at the power supply potential), and has inactivated other write bit lines (has set them at the ground potential). When the write operation is started, the control circuit 14 sets each register 13 in the input state. Similarly, the control circuit 19 sets each register 18 in the input state. Consequently, the registers 13 and 18 corresponding to the write bit line WBL1 receive a logical high. On the other hand, the registers 13 and 18 corresponding to the write bit lines WBL2 to WBLm receive a logical low.

Then, the control circuit 14 sets each register 13 in the storage state. Similarly, the control circuit 19 sets each register 18 in the storage state. Consequently, the registers 13 and 18 temporarily store the logic states received in the input state. In this state, the registers 13 and 18 store the logic states received in the input state regardless of the potentials of the write bit lines WBL. The register 13 corresponding to the write bit line WBL1 turns on the corresponding pass transistor 12. Analogously, the register 18 corresponding to the write bit line WBL1 turns on the corresponding pass transistor 17.

Subsequently, the control circuit 14 controls the connection state in the write power supply circuit 15 so as to connect the source terminal of the pass transistor 12 to the current source which supplies the write current. Also, the control circuit 19 controls the connection state in the write power supply circuit 20 so as to connect the source terminal of the pass transistor 17 to the current sink which draws the write current. As a consequence, the write current flowing from the first write circuit 11 to the second write circuit 16 flows through only the write bit line WBL1.

The control circuit 14 then initializes each register 13. Each register 13 turns off the corresponding pass transistor 12. This electrically disconnects the write bit line WBL1 and write power supply circuit 15. Also, the control circuit 19 initializes each register 18. Each register 18 turns off the corresponding pass transistor 17. This electrically disconnects the write bit line WBL1 and write power supply circuit 20. In this manner, the write operation is completed.

An operation when the write current flows from the second write circuit 16 to the first write circuit 11 through the write bit line WBL will be explained below. The operation is the same as for the write current in the opposite direction described above until the pass transistors 12 and 17 corresponding to the write bit line WBL1 are turned on.

Then, the control circuit 14 controls the connection state in the write power supply circuit 15 so as to connect the source terminal of the pass transistor 12 to the current sink for drawing the write current. Also, the control circuit 19 controls the connection state in the write power supply circuit 20 so as to connect the source terminal of the pass transistor 17 to the current source for supplying the write current. Consequently, the write current flowing from the second write circuit 16 to the first write circuit 11 flows through only the write bit line WBL1.

Subsequently, the control circuit 14 initializes each register 13. Each register 13 turns off the corresponding pass transistor 12. This electrically disconnects the write bit line WBL1 and write power supply circuit 15. Also, the control circuit 19 initializes each register 18. Each register 18 turns off the corresponding pass transistor 17. This electrically disconnects the write bit line WBL1 and write power supply circuit 20. In this way, the write operation is completed.

In the first embodiment as described in detail above, the write circuits 11 and 16 for supplying the write current to the write bit line WBL can share one decoder circuit (the column decoder 22). This increases the cell occupation ratio of the semiconductor memory device.

In addition, the registers 13 and 18 can store the logic state received in the input state regardless of the potential of the write bit line WBL. That is, when the registers 13 and 18 are in the storage state, the write bit line WBL can be used as a signal line for controlling an operation except for the write operation. More specifically, the write bit line WBL can be used as a column select line or the like. This reduces the wiring layers of the semiconductor memory device. As a consequence, the fabrication cost can be reduced.

Note that this embodiment is applicable not only to the write bit line WBL but also to another line.

Second Embodiment

The second embodiment uses the gate capacitance of a MOS transistor (pass transistor 12 or 17) as an element for temporarily storing the logic state of a write bit line WBL.

Figure 7:
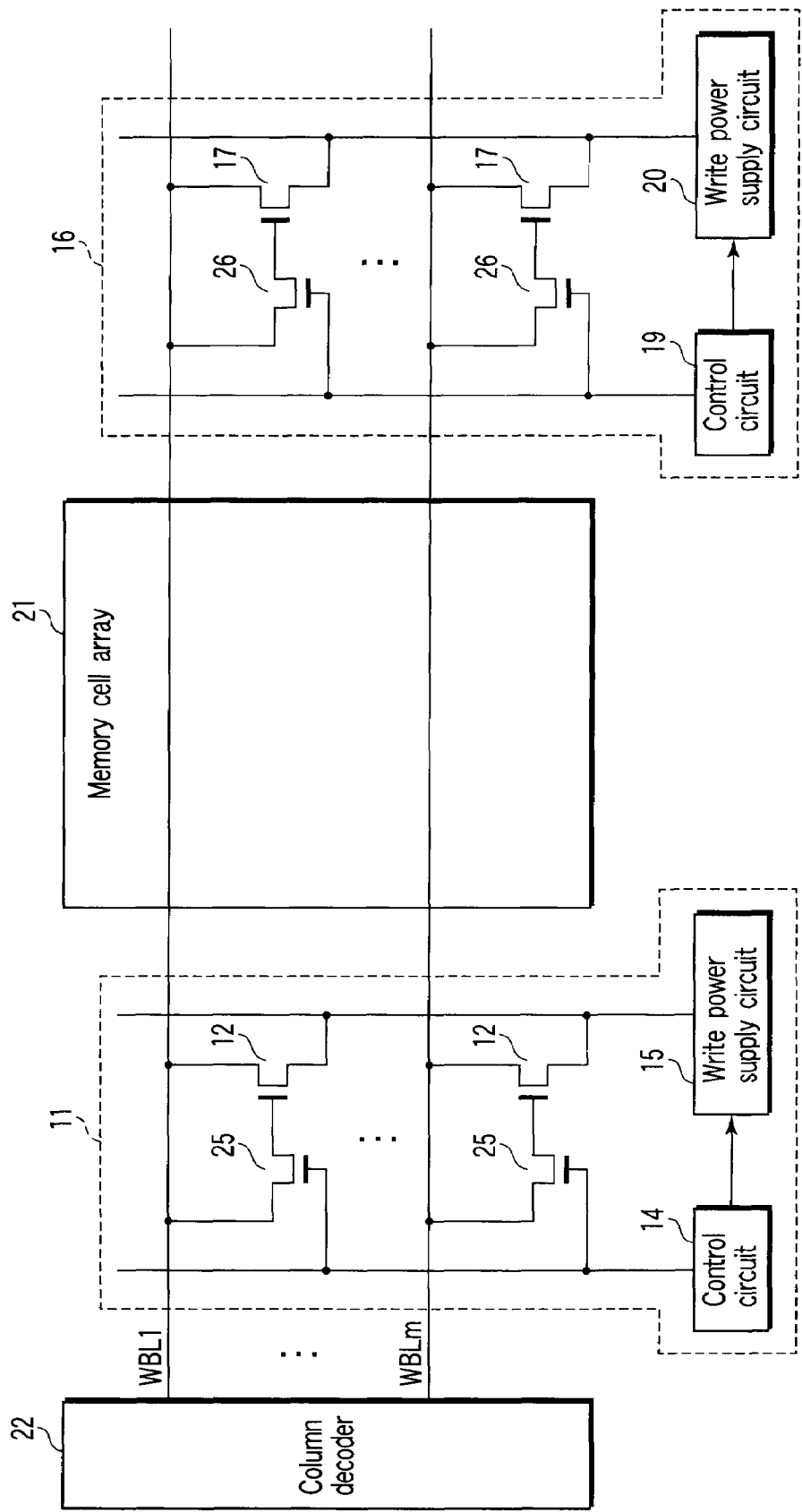
FIG. 7 is a circuit block diagram illustrating an MRAM according to the second embodiment.

FIG. 7 is a circuit block diagram illustrating an MRAM according to the second embodiment of the present invention. A first write circuit 11 comprises a control circuit 14, a write power supply circuit 15, and a plurality of pass transistors 25 and a plurality of pass transistors 12 corresponding to write bit lines WBL1 to WBLm. The pass transistors 25 is, e.g., an n-channel MOS transistor. The gate capacitance of the pass transistor 12 functions as a storage element for temporarily storing the logic state of the write bit line WBL.

The drain terminal of each pass transistor 25 connects to the corresponding write bit line WBL. The source terminal of each pass transistor 25 connects to the gate terminal of the corresponding pass transistor 12. The gate terminal of each pass transistor 25 connects to the control circuit 14.

A second write circuit 16 comprises a control circuit 19, a write power supply circuit 20, and a plurality of pass transistors 26 and a plurality of pass transistors 17 corresponding to the write bit lines WBL1 to WBLm. The gate capacitance of the pass transistor 17 functions as a storage element for temporarily storing the logic state of the write bit line WBL.

The drain terminal of each pass transistor 26 connects to the corresponding write bit line WBL. The source terminal of each pass transistor 26 connects to the gate terminal of the corresponding pass transistor 17. The gate terminal of each pass transistor 26 connects to the control circuit 19.

The operation of the MRAM having the above arrangement will be explained below. Assume that in order to write data in an arbitrary memory cell MC of a memory cell array 21, a column decoder 22 has activated the write bit line WBL1. When the write operation is started, the control circuit 14 supplies a high signal to the gate terminal of each pass transistor 25, thereby turning on the pass transistor 25. Also, the control circuit 19 supplies a high signal to the gate terminal of each pass transistor 26, thereby turning on the pass transistor 26.

Accordingly, a high potential (power supply potential) is applied to the gate terminals of the pass transistors 12 and 17 corresponding to the write bit line WBL1. On the other hand, a low potential (ground potential) is applied to the gate terminals of the pass transistors 12 and 17 corresponding to the write bit lines WBL2 to WBLm. As a consequence, only the pass transistors 12 and 17 corresponding to the write bit line WBL1 are turned on.

Then, the control circuit 14 supplies a low signal to the gate terminal of each pass transistor 25, thereby turning off the pass transistor 25. Also, the control circuit 19 supplies a low signal to the gate terminal of each pass transistor 26, thereby turning off the pass transistor 26.

Consequently, the gate capacitances of the pass transistors 12 and 17 corresponding to the write bit line WBL1 keep the gate terminals of the pass transistors 12 and 17 at the high potential, thereby keeping the pass transistors 12 and 17 on. On the other hand, the gate terminals of the pass transistors 12 and 17 corresponding to the write bit lines WBL2 to WBLm are kept at the low potential, so the pass transistors 12 and 17 are kept off. That is, the logic states of the write bit lines WBL can be stored in the pass transistors 12 and 17.

The control circuit 14 then controls the connection state between the source terminal of the pass transistor 12 and a current source or current sink of the write power supply circuit 15. Also, the control circuit 19 controls the connection state between the source terminal of the pass transistor 17 and a current source or current sink of the write power supply circuit 20. Accordingly, a write current corresponding to the data can be supplied to the write bit line WBL1.

Subsequently, the control circuit 14 supplies a high signal to the gate terminal of each pass transistor 25, thereby turning on the pass transistor 25. Also, the control circuit 19 supplies a high signal to the gate terminal of each pass transistor 26, thereby turning on the pass transistor 26. To complete the write operation, the column decoder 22 inactivates all the write bit lines WBL. This turns off the pass transistors 12 and 17, and electrically disconnects the write bit lines WBL and the write power supply circuits 15 and 20.

In the second embodiment as described in detail above, the logic state of the write bit line WBL can be stored by using the gate capacitance of the pass transistor 12. It is also possible to set the gate terminal of the pass transistor 12 in the input state or storage state by inserting the pass transistor 25 between the gate terminal of the pass transistor 12 and the write bit line WBL. That is, the logic state of the write bit line WBL can be temporarily stored by using the two pass transistors 12 and 25. This simplifies the configuration of the write circuit. Other effects are the same as in the first embodiment.

Third Embodiment

The third embodiment discloses an example of a practical arrangement of a write power supply circuit 15. FIG. 8 is a circuit block diagram illustrating an MRAM according to the third embodiment of the present invention.

The write power supply circuit 15 comprises a current source 15A, a p-channel MOS (p-MOS) transistor 15B as a switching element, an n-channel MOS (n-MOS) transistor 15C as a switching element, and a ground terminal 15D to which ground potential is applied.

The source terminal of the p-MOS transistor 15B connects to the current source 15A. The drain terminal of the p-MOS transistor 15B connects to the source terminal of each pass transistor 12. The source terminal of the n-MOS transistor 15C connects to the ground terminal 15D. The drain terminal of the n-MOS transistor 15C connects to the source terminal of each pass transistor 12. The gate terminals of the p-MOS transistor 15B and n-MOS transistor 15C connect to a control circuit 14.

The current source 15A generates a write current. When a write circuit 11 supplies the write current, the control circuit 14 supplies a low signal to the p-MOS transistor 15B. This turns on the p-MOS transistor 15B to connect the pass transistors 12 to the current source 15A.

On the other hand, when the write circuit 11 draws the write current, the control circuit 14 supplies a high signal to the n-MOS transistor 15C. This turns on the n-MOS transistor 15C to connect the pass transistors 12 to the ground terminal 15D.

Similarly, a write power supply circuit 20 comprises a current source 20A, a p-MOS transistor 20B, an n-MOS transistor 20C, and a ground terminal 20D to which the ground potential is applied. The connection relationships are the same as in the write power supply circuit 15 described above.

The write power supply circuit having the above arrangement can supply a bidirectional write current to a write bit line WBL.

Fourth Embodiment

The fourth embodiment is an example in which the present invention is applied to an MRAM having a plurality of memory cell arrays. In this embodiment, these memory cell arrays share write bit lines WBL.

Figure 9:
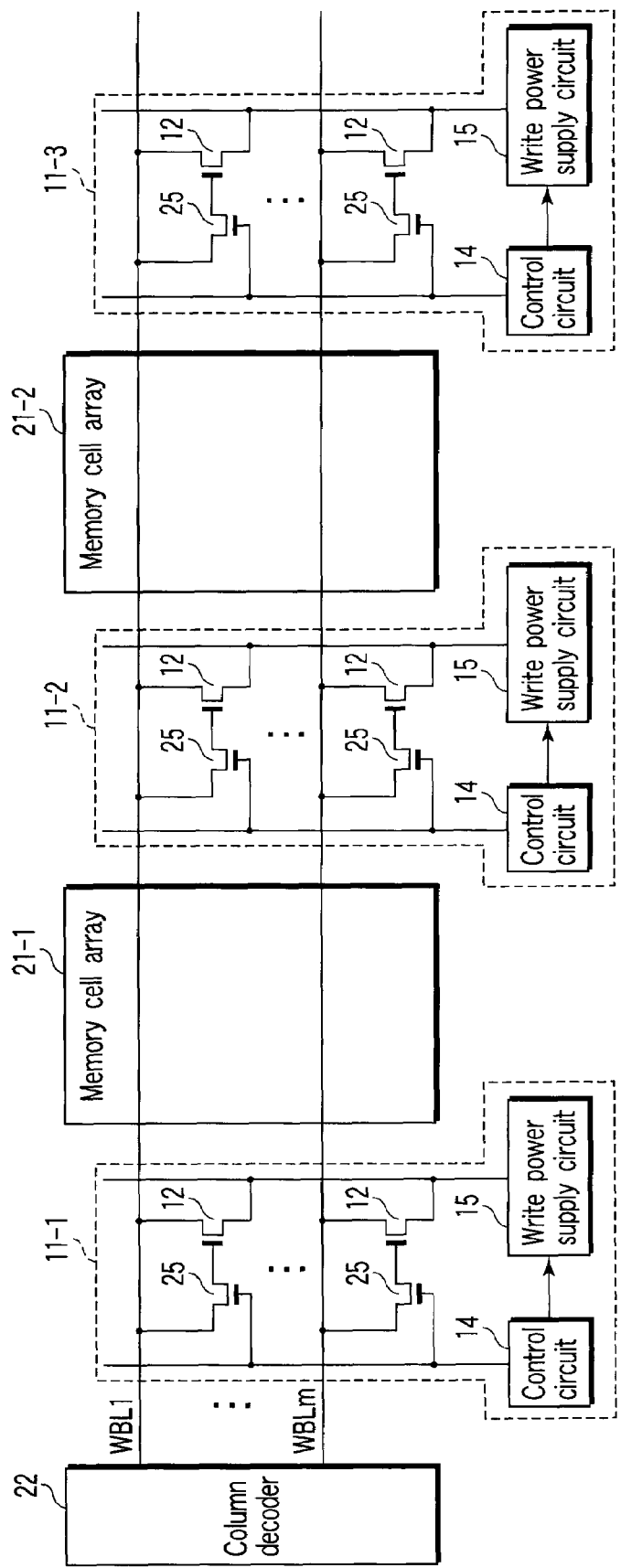
FIG. 9 is a circuit block diagram illustrating an MRAM according to the fourth embodiment.

FIG. 9 is a circuit block diagram illustrating an MRAM according to the fourth embodiment of the present invention. The MRAM has two memory cell arrays 21-1 and 21-2. The arrangement of each of the memory cell arrays 21-1 and 21-2 is the same as the memory cell array shown in FIG. 5. The two memory cell arrays 21-1 and 21-2 share write bit lines WBL1 to WBLm. A column decoder 22 connects to the write bit lines WBL1 to WBLm.

The MRAM comprises three write circuits 11-1, 11-2, and 11-3. The arrangement of each of the write circuits 11-1, 11-2, and 11-3 is the same as the write circuit 11 shown in FIG. 7. The write circuits 11-1, 11-2, and 11-3 connect to the write bit lines WBL1 to WBLm.

The write circuit 11-1 connects to one end of each write bit line WBL. The write circuit 11-2 is placed between the memory cells arrays 21-1 and 21-2 and connected to the middle portion of each write bit line WBL. The write circuit 11-3 connects to the other end of each write bit line WBL. In other words, the memory cell array 21-1 is placed between the write circuits 11-1 and 11-2. The memory cell array 21-2 is placed between the write circuits 11-2 and 11-3.

The write circuits 11-1 and 11-2 supply bidirectional write currents to the memory cell array 21-1. The write circuits 11-2 and 11-3 supply bidirectional write currents to the memory cell array 21-2. The operation of controlling the write currents is the same as in the second embodiment.

In the fourth embodiment as described in detail above, a plurality of memory cell arrays can share the write bit lines WBL. In addition, data can be normally written to each memory cell array by preparing only one column decoder 22 for a plurality of memory cell arrays.

Note that the fourth embodiment is also applicable to the first to third embodiments described above.

Fifth Embodiment

In the fifth embodiment, current sources and current sinks as power supply circuits included in write circuits are alternately arranged.

Figure 10:
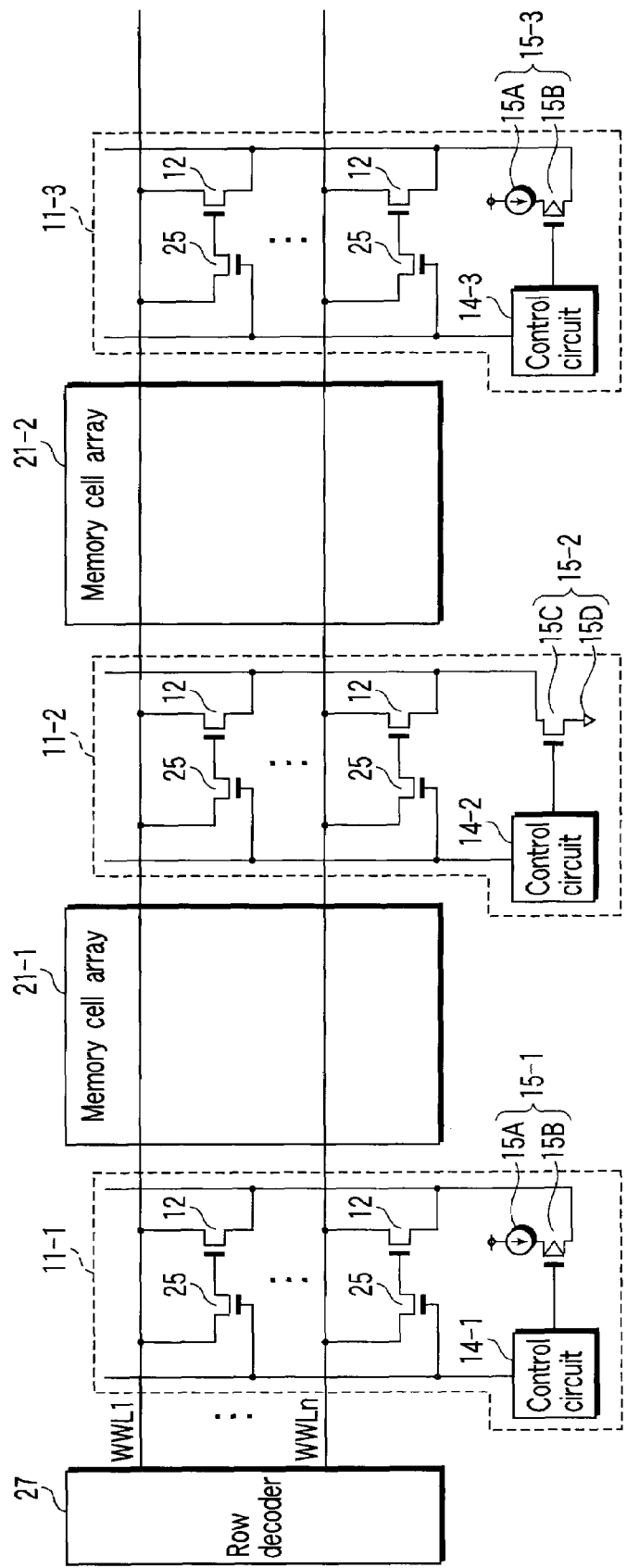
FIG. 10 is a circuit block diagram illustrating an MRAM according to the fifth embodiment.

FIG. 10 is a circuit block diagram illustrating an MRAM according to the fifth embodiment of the present invention. Current sources and current sinks for supplying write currents are alternately arranged via memory cell arrays. Accordingly, this embodiment is applicable to only lines which connect to write circuits 11 and receive unidirectional write currents. This embodiment will explain write word lines WWL as the lines connected to the write circuits 11.

A row decoder 27 connects to the write word lines WWL. The row decoder 27 decodes an externally supplied row address signal, and selects a corresponding one of the write word lines WWL.

Write circuits 11-1, 11-2, and 11-3 connect to the write word lines WWL. A memory cell array 21-1 is placed between the write circuits 11-1 and 11-2. A memory cell array 21-2 is placed between the write circuits 11-2 and 11-3.

The drain terminal of each pass transistor 25 connects to a corresponding write word line WWL. The drain terminal of each pass transistor 12 connects to a corresponding one of the write word lines WWL.

The write circuit 11-1 has a control circuit 14-1 and write power supply circuit 15-1. The write power supply circuit 15-1 comprises a current source 15A and p-MOS transistor 15B. The source terminal of the p-MOS transistor 15B connects to the current source 15A. The drain terminal of the p-MOS transistor 15B connects to the source terminal of each pass transistor 12 in the write power supply circuit 15-1. The gate terminal of the p-MOS transistor 15B connects to the control circuit 14-1.

The write circuit 11-2 has a control circuit 14-2 and write power supply circuit 15-2. The write power supply circuit 15-2 comprises a ground terminal 15D and n-MOS transistor 15C. The drain terminal of the n-MOS transistor 15C connects to the source terminal of each pass transistor 12 in the write circuit 11-2. The source terminal of the n-MOS transistor 15C connects to the ground terminal 15D. The gate terminal of the n-MOS transistor 15C connects to the control circuit 14-2.

The write circuit 11-3 has a control circuit 14-3 and write power supply circuit 15-3. The write power supply circuit 15-3 comprises a current source 15A and p-MOS transistor 15B. The source terminal of the p-MOS transistor 15B connects to the current source 15A. The drain terminal of the p-MOS transistor 15B connects to the source terminal of each pass transistor 12 in the write circuit 11-3. The gate terminal of the p-MOS transistor 15B connects to the control circuit 14-3.

The operation of the MRAM having the above arrangement will be explained below. Assume that in order to write data in an arbitrary memory cell MC of the memory cell array 21-1, the row decoder 27 has activated a write word line WWL1 (has set it at the power supply potential). When the write operation is started, the control circuit 14-1 supplies a high signal to the gate terminal of each pass transistor 25, thereby turning on the pass transistor 25. Also, the control circuit 14-2 supplies a high signal to the gate terminal of each pass transistor 25, thereby turning on the pass transistor 25.

Accordingly, a high potential is applied to the gate terminals of the pass transistors 12 corresponding to the write word line WWL1. On the other hand, a low potential is applied to the gate terminals of the pass transistors 12 corresponding to write word lines WWL2 to WWLn. As a consequence, only the pass transistors 12 corresponding to the write word line WWL1 are turned on.

Then, the control circuit 14-1 supplies a low signal to the gate terminal of each pass transistor 25, thereby turning off the pass transistor 25. Also, the control circuit 14-2 supplies a low signal to the gate terminal of each pass transistor 25, thereby turning off the pass transistor 25.

Consequently, the gate capacitances of the two pass transistors 12 corresponding to the write bit line WBL1 keep the gate terminals of the pass transistors 12 at the high potential, thereby keeping the pass transistors 12 on. On the other hand, the gate terminals of the pass transistors 12 corresponding to the write word lines WWL2 to WWLn are kept at the low potential, so the pass transistors 12 are kept off. That is, the logic states of the write word lines WWL can be stored in the pass transistors 12.

Subsequently, the control circuit 14-1 supplies a low signal to the gate terminal of the p-MOS transistor 15B to turn it on. Also, the control circuit 14-2 supplies a high signal to the gate terminal of the n-MOS transistor 15C to turn it on. Therefore, a write current flowing from the write circuit 11-1 to the write circuit 11-2 can be supplied to only the write word line WWL1.

When the write operation is completed, the control circuits 14-1 and 14-2 initialize the gate capacitances of the pass transistors 12.

Meanwhile, a write current flowing from the write circuit 11-3 to the write circuit 11-2 is supplied to the write word lines WWL formed in the memory cell array 21-2. The operation of the control circuit 14-2 in this case is the same as described above. Also, the operation of the control circuit 14-3 in this case is the same as the control circuit 14-1 described above.

In the fifth embodiment as described in detail above, the present invention is applicable to the write word line WWL which supplies a unidirectional write current. Furthermore, the fifth embodiment can simplify the write power supply circuit included in the write circuit. That is, the fifth embodiment can reduce the size of each write circuit. Note that this embodiment can be similarly practiced even when a register is used as an element for storing the logic state of a line as in the first embodiment.

Sixth Embodiment

The sixth embodiment is an example in which a register for temporarily storing the logic state of a write bit line WBL comprises two inverter circuits connected in the form of a loop.

Figure 11:
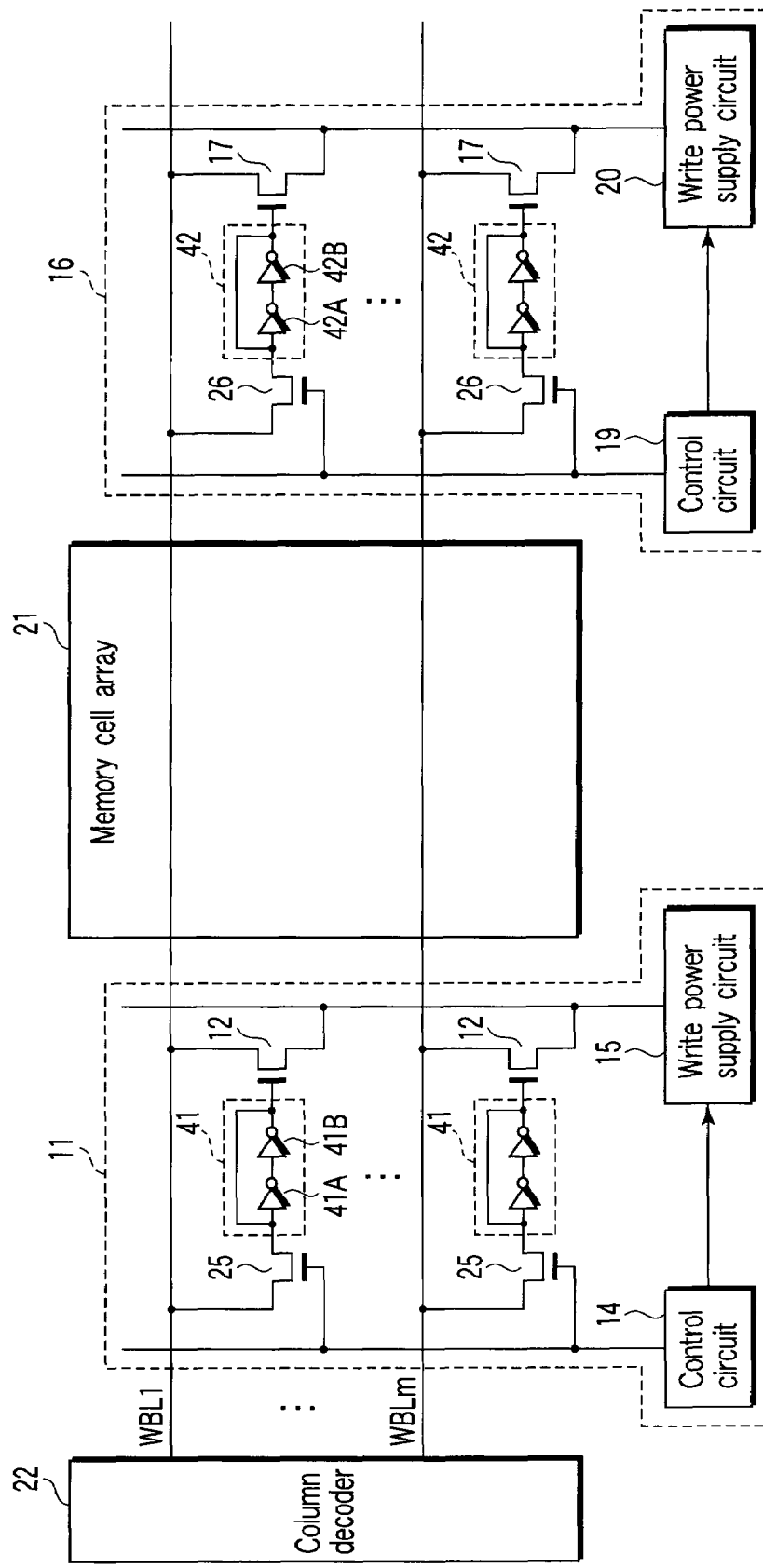
FIG. 11 is a circuit block diagram illustrating an MRAM according to the sixth embodiment.

FIG. 11 is a circuit block diagram illustrating an MRAM according to the sixth embodiment of the present invention. A write circuit 11 includes a plurality of registers 41 corresponding to write bit lines WBL1 to WBLm.

Each register 41 comprises two inverter circuits 41A and 41B. The output of the inverter circuit 41A connects to the input of the inverter circuit 41B. The output of the inverter circuit 41B connects to the input of the inverter circuit 41A. The input of the inverter circuit 41A connects to the source terminal of a corresponding pass transistor 25. The output of the inverter circuit 41B connects to the gate terminal of a corresponding pass transistor 12.

A write circuit 16 includes a plurality of registers 42 corresponding to the write bit lines WWL1 to WWLm. Each register 42 comprises two inverter circuits 42A and 42B. The output of the inverter circuit 42A connects to the input of the inverter circuit 42B. The output of the inverter circuit 42B connects to the input of the inverter circuit 42A. The input of the inverter circuit 42A connects to the source terminal of a corresponding pass transistor 26. The output of the inverter circuit 42B connects to the gate terminal of a corresponding pass transistor 17.

The operation of the MRAM having the above arrangement will be explained below. Assume that in order to write data in an arbitrary memory cell MC of a memory cell array 21, a column decoder 22 has activated the write bit line WBL1. When the write operation is started, a control circuit 14 supplies a high signal to the gate terminal of each pass transistor 25, thereby turning on the pass transistor 25. Also, a control circuit 19 supplies a high signal to the gate terminal of each pass transistor 26, thereby turning on the pass transistor 26.

Accordingly, a high potential is applied to the input of the inverter circuit 41A corresponding to the write bit line WBL1. The two inverter circuits 41A and 41B function as a latch circuit for storing data. Therefore, the register 41 temporarily stores the logic state of the write bit line WBL1.

Similarly, a high potential is applied to the input of the inverter circuit 42A corresponding to the write bit line WBL1. Therefore, the register 42 temporarily stores the logic state of the write bit line WBL1. After that, the control circuit 14 supplies a low signal to the gate terminal of each pass transistor 25, thereby turning off the pass transistor 25. Also, the control circuit 19 supplies a low signal to the gate terminal of each pass transistor 26, thereby turning off the pass transistor 26.

Consequently, the pass transistors 12 and 17 corresponding to the write bit line WBL1 are turned on. A write current is supplied in a direction corresponding to the write data to the write bit line WBL1.

To complete the write operation, the column decoder 22 inactivates all the write bit lines WBL. The control circuit 14 supplies a high signal to the gate terminal of each pass transistor 25, thereby turning on the pass transistor 25. Also, the control circuit 19 supplies a high signal to the gate terminal of each pass transistor 26, thereby turning on the pass transistor 26. Accordingly, the registers 41 and 42 temporarily store the logic state (low) of the write bit lines WBL. This turns off the pass transistors 12 and 17, and electrically disconnects the write bit lines WBL and write power supply circuits 15 and 20.

In the sixth embodiment as described in detail above, the two inverter circuits can store the logic state of the write bit line WBL. Since this reduces the current leak of the register, the stored logic level can be held constant. That is, it is possible to improve the data retention characteristics of the element for storing the logic state of the write bit line WBL.

Note that the sixth embodiment is also applicable to an MRAM having a plurality of memory cell arrays.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a power supply circuit which generates a write current;
a write line to which a logic state is transferred;
a first pass transistor connected between the power supply circuit and the write line; and
a first register which connects to the write line, receives the logic state of the write line in an input state, stores the received logic state in a storage state, and controls an on/off state of the first pass transistor on the basis of the stored logic state.

2. The device according to claim 1, further comprising:
a control circuit which controls the input state and the storage state of the first register.

3. The device according to claim 1, further comprising:
a second pass transistor connected between the write line and the first register,
wherein the first register includes a first inverter circuit and a second inverter circuit, an output terminal of the first inverter circuit connects to an input terminal of the second inverter circuit, and an output terminal of the second inverter circuit connects to an input terminal of the first inverter circuit,
a gate terminal of the first pass transistor connects to the output terminal of the second inverter circuit; and
the second pass transistor connects to the input terminal of the first inverter circuit.

4. The device according to claim 3, further comprising:
a control circuit which controls the second pass transistor to be turned on in the input state and turned off in the storage state.

5. The device according to claim 1, further comprising:
a memory cell array having a plurality of memory cells which record data by the write current.

6. The device according to claim 5, further comprising:
a current sink which draws the write current;
a second pass transistor connected between the current sink and the write line; and
a second register which connects to the write line, receives a logic state of the write line in an input state, stores the received logic state in a storage state, and controls an on/off state of the second pass transistor on the basis of the stored logic state,
wherein the power supply circuit comprises a current source, and
the memory cell array is placed between the first pass transistor and the second pass transistor.

7. The device according to claim 5, wherein the memory cell includes:
a free layer which is made of a ferromagnetic material and has a changeable magnetization direction;
a fixed layer which is made of a ferromagnetic material and has a fixed magnetization direction; and
a nonmagnetic layer provided between the free layer and the fixed layer.

8. The device according to claim 1, further comprising:
a plurality of memory cell arrays having a plurality of memory cells which record data by the write current,
wherein the plurality of memory cell arrays share the write line.

9. The device according to claim 8, wherein the memory cell includes:
a free layer which is made of a ferromagnetic material and has a changeable magnetization direction;
a fixed layer which is made of a ferromagnetic material and has a fixed magnetization direction; and
a nonmagnetic layer provided between the free layer and the fixed layer.

10. The device according to claim 1, further comprising:
a decoder which connects to the write line and transfers the logic state.

11. A semiconductor memory device comprising:
a power supply circuit which generates a write current;
a write line to which a logic state is transferred;
a first pass transistor connected between the power supply circuit and the write line; and
a second pass transistor connected between the write line and a gate terminal of the first pass transistor,
wherein the first pass transistor has a gate capacitance, and stores a logic state of the write line by using the gate capacitance.

12. The device according to claim 11, further comprising:
a control circuit which controls an on/off state of the second pass transistor,
wherein the first pass transistor receives the logic state of the write line while the second pass transistor is on, and stores the received logic state while the second pass transistor is off.

13. The device according to claim 11, further comprising:
a memory cell array having a plurality of memory cells which record data by the write current.

14. The device according to claim 13, further comprising:
a current sink which draws the write current;

a third pass transistor connected between the current sink and the write line; and a fourth pass transistor connected between the write line and a gate terminal of the third pass transistor, wherein the fourth pass transistor has a gate capacitance, and stores the logic state of the write line by using the gate capacitance, the power supply circuit comprises a current source, and the memory cell array is placed between the first pass transistor and the third pass transistor.

15. The device according to claim 13, wherein the memory cell includes:

a free layer which is made of a ferromagnetic material and has a changeable magnetization direction;

a fixed layer which is made of a ferromagnetic material and has a fixed magnetization direction; and a nonmagnetic layer provided between the free layer and the fixed layer.

16. The device according to claim 11, further comprising:

a plurality of memory cell arrays having a plurality of memory cells which record data by the write current, wherein the plurality of memory cell arrays share the write line.

17. The device according to claim 16, wherein the memory cell includes:

a free layer which is made of a ferromagnetic material and has a changeable magnetization direction;

a fixed layer which is made of a ferromagnetic material and a fixed magnetization direction; and a nonmagnetic layer provided between the free layer and the fixed layer.

18. The device according to claim 11, further comprising:

a decoder which connects to the write line and transfers the logic state.

19. A writing method for a semiconductor memory device comprising a pass transistor connected between a power supply circuit and a write line, a register switching the pass transistor, and a memory cell array having a plurality of memory cells connected to the write line, the method comprising:

setting the register in an input state;

receiving a logic state from the write line to the register;

setting the register in the storage state;

switching the pass transistor based on an output from the register, the pass transistor supplying a current from the power supply circuit to the write line to writing the memory cell; and initializing the register.

20. The writing method according to claim 19, wherein the device further comprises a control circuit, and the control circuit controls the register and the power supply circuit.

* * * * *